(12) United States Patent
Baston

(10) Patent No.: US 6,573,723 B2
(45) Date of Patent: Jun. 3, 2003

(54) CURRENT MEASURING APPARATUS FOR BATTERY

(75) Inventor: David C. Baston, Winchester, MA (US)

(73) Assignee: Microchip Technology Inc.

( * ) Notice: Subject to any disclaimer, the term of this patent is extended or adjusted under 35 U.S.C. 154(b) by 0 days.

(21) Appl. No.: 09/826,261

(22) Filed: Apr. 4, 2001

(65) Prior Publication Data

US 2001/0033171 A1 Oct. 25, 2001

Related U.S. Application Data

(60) Provisional application No. 60/194,435, filed on Apr. 4, 2000.

(51) Int. Cl.[7] .............................................. G01N 27/416
(52) U.S. Cl. ....................................... 324/426; 429/178
(58) Field of Search ................................ 324/426, 428, 324/430; 320/107, 104; 428/90, 96, 97, 98, 178, 179, 180

(56) References Cited

U.S. PATENT DOCUMENTS

| 3,660,759 A | 5/1972 | Parmater | 324/29.5 |
| 5,629,680 A | 5/1997 | Makhija | 340/664 |
| 5,652,069 A | 7/1997 | Sakai et al. | 429/92 |
| 5,841,284 A | 11/1998 | Takahashi | 324/428 |
| 6,001,506 A | 12/1999 | Timmons et al. | 429/178 |
| 6,097,193 A * | 8/2000 | Bramwell | 324/429 |
| 6,310,614 B1 * | 10/2001 | Maeda et al. | 345/173 |

OTHER PUBLICATIONS

Battery Council International, Jan. 18, 2001; How A Battery Works; pp 1–3.
Autobatteries.com, Jan. 18, 2001; Definitions, pp 1–2.
Battery Council International, Jan. 18, 2001; How a Battery is Made; pp 1–5.

* cited by examiner

*Primary Examiner*—Shawn Riley
*Assistant Examiner*—Lawrence Luk
(74) *Attorney, Agent, or Firm*—Baker Botts L.L.P.

(57) ABSTRACT

An apparatus for measuring electrical energy passing to and from a battery post. The apparatus includes a resistor having a known resistance, a first conducting surface and a second conducting surface. The conducting surfaces are arranged such that current flow from a battery post will travel through the resistor from the first conducting surface to the second conducting surface, and current flow to the post travels through the resistor from the second to the first conducting surfaces. The energy measuring apparatus further includes a first lead electrically connected to the first conducting surface of the resistor, and a second lead electrically connected to the second conducting surface of the resistor.

43 Claims, 7 Drawing Sheets

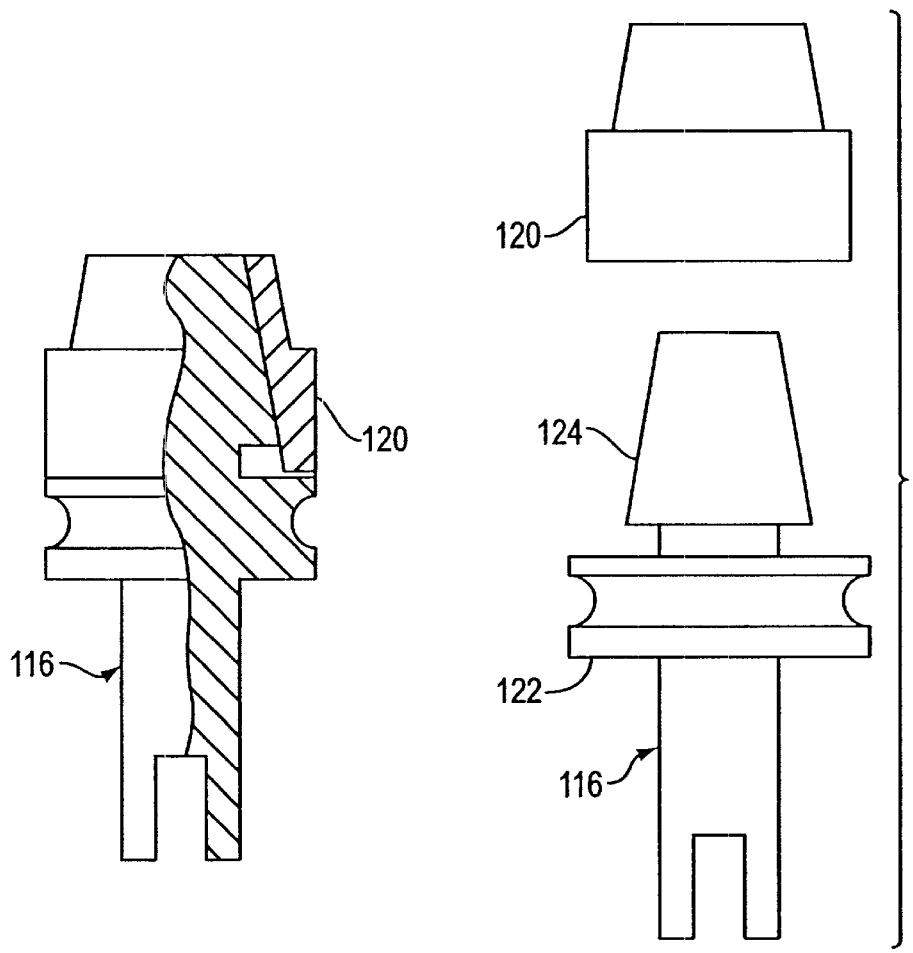

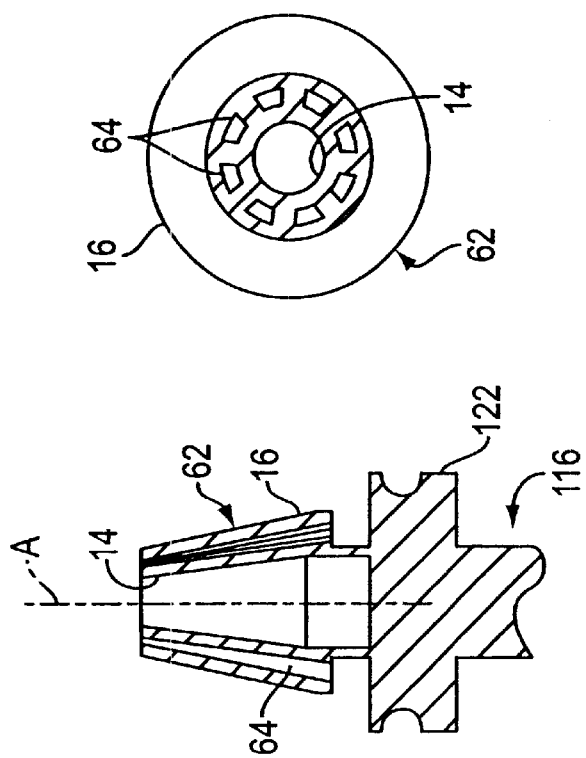
FIG. 9
FIG. 8
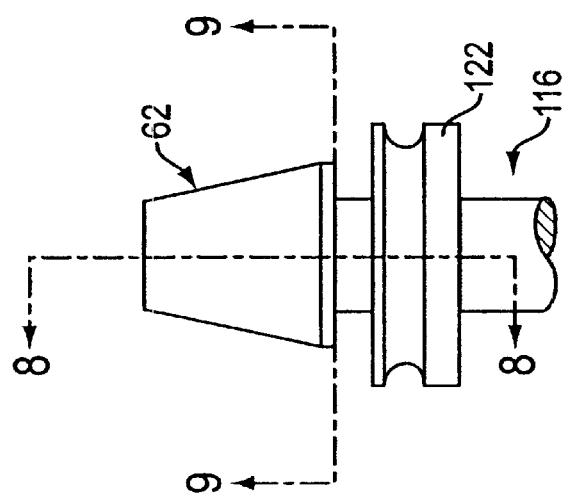
FIG. 7

CURRENT MEASURING APPARATUS FOR BATTERY

CROSS-REFERENCE TO RELATED APPLICATIONS

The present application claims priority to provisional U.S. patent application Ser. No. 60/194,435, filed Apr. 4, 2000, which is assigned to the assignee of the present disclosure and incorporated herein by reference.

BACKGROUND OF DISCLOSURE

1. Field of Disclosure

The present disclosure relates to batteries and, more particularly, to an apparatus for measuring current flow to and from a terminal post of a battery.

2. Related Art

The present disclosure is described in conjunction with a lead-acid battery of the type used to provide starting power in vehicles, such as automobiles, trucks and motorcycles. This type of battery generally includes a plastic casing containing positive and negative lead plates immersed in an acid electrolyte. The plates are separated by non-conductive sheets, and a positive lead strap connects the positive plates while a negative lead strap connects the negative plates. Lead posts are connected to each strap and extend through the casing, and lead positive and negative battery terminals are secured to the ends of the posts outside the casing for receiving cable connectors.

Presently, means for monitoring the status of batteries normally measures the voltage provided between the battery terminals. However, battery voltage in itself provides limited information as to battery status and performance. What is desired instead is an apparatus for monitoring the flow of current into and out of the battery. The current flow can then be used over time to calculate and monitor the level of charge of the battery. Preferably, the apparatus will be simple in design, and easily incorporated in a battery.

SUMMARY OF DISCLOSURE

In response, the present disclosure provides an apparatus for measuring electrical energy passing to and from a battery post. The apparatus includes a resistor for providing an electrical connection to a battery post, and the resistor has a known resistance, a first conducting surface and a second conducting surface. The conducting surfaces are arranged such that current flow from the post will travel through the resistor from the first conducting surface to the second conducting surface, and current flow to the post travels through the resistor from the second to the first conducting surfaces. The energy measuring apparatus further includes a first lead electrically connected to the first conducting surface of the resistor, and a second lead electrically connected to the second conducting surface of the resistor.

According to one aspect of the present disclosure, the apparatus further includes a volt meter connected between the first and the second leads for measuring a voltage drop across the resistor.

According to another aspect, the apparatus further includes a computer having memory for storing the known resistance of the resistor, and a processor programmed to receive the measured voltage drop from the volt meter, retrieve the known resistance from the memory, and calculate current flow through the resistor based on the measured voltage drop and the known resistance.

The present disclosure also provides a battery including the measuring apparatus, and further including a case, a storage cell contained within the case for receiving and storing an electrical charge, and an electrically conductive post connected to the storage cell and extending out of the case. The first conducting surface of the resistor is positioned on a portion of the post extending out of the case.

According to an aspect of the present disclosure, the storage cell of the battery includes lead and lead-oxide plates immersed in an acid electrolyte.

These and other aspects of the present disclosure will become apparent to those skilled in the art after a reading of the following description of the preferred embodiment when considered with the drawings.

BRIEF DESCRIPTION OF DRAWINGS

The present disclosure is described with reference to the accompanying drawings, wherein:

FIG. 2 is a side elevation view, partially cut-away of a post and terminal of the battery of FIG. 1;

FIG. 3 is an exploded side elevation view of the post and the terminal of the battery of FIG. 1;

FIG. 7 is a side elevation view of a further resistor for use with the apparatus of the present disclosure;

FIG. 8 is a sectional view of the resistor taken along line 8—8 of FIG. 7;

FIG. 9 is a sectional view of the resistor taken along line 9—9 of FIG. 7;

Like reference characters designate identical or corresponding components and units throughout the several views.

DETAILED DESCRIPTION OF DISCLOSURE

Figure 4:
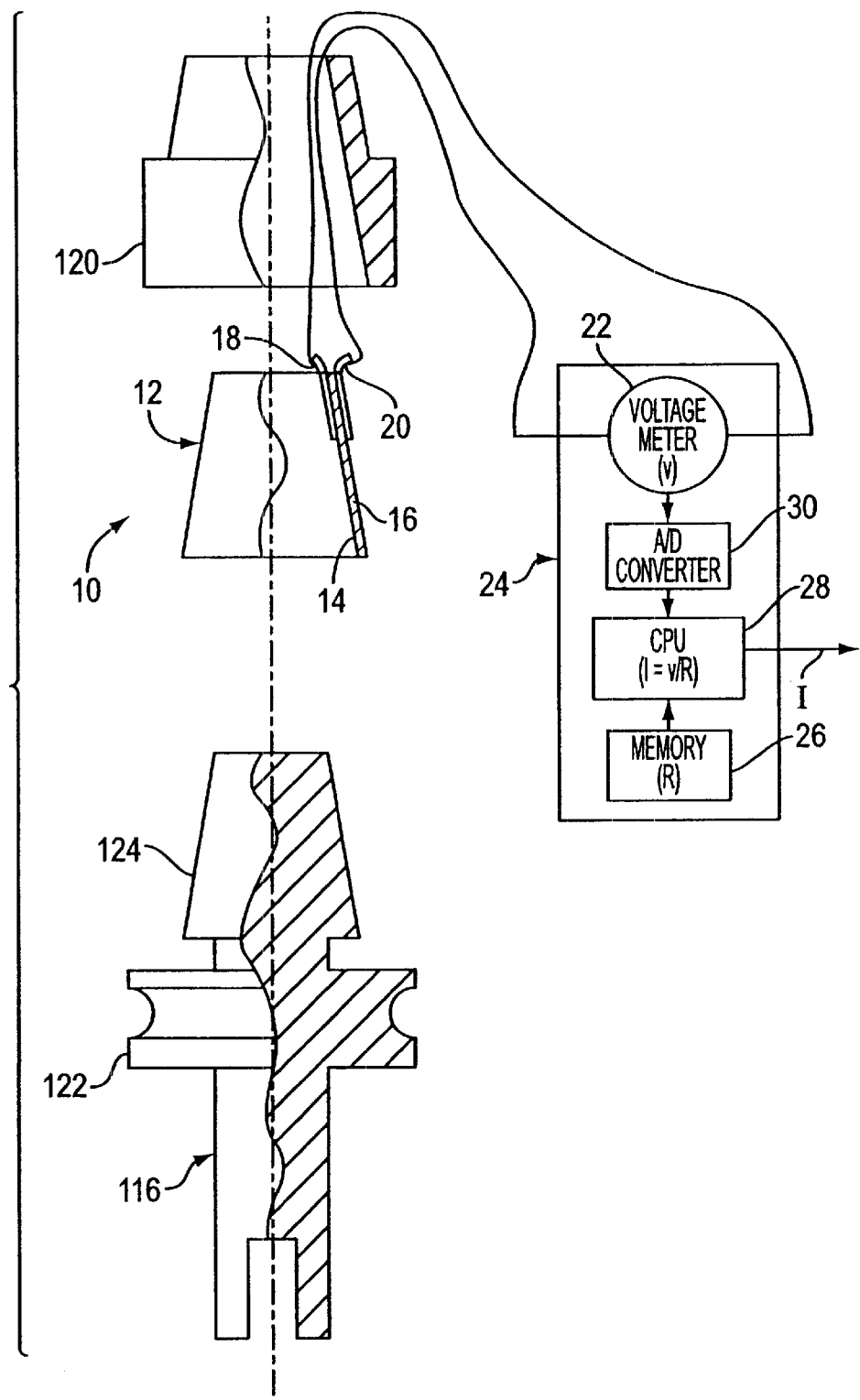
FIG. 4 is an exploded side elevation view, partially cut away, of an apparatus constructed in accordance with the present disclosure including a sleeve-like resistor positioned between the post and the terminal of the battery of FIG. 1.

Referring now to the drawings in general, it will be understood that the illustrations are for the purpose of describing preferred embodiments of the disclosure and are not intended to limit the disclosure thereto. As shown in FIG. 4, the present disclosure provides an apparatus 10 for measuring electrical energy passing to and from a battery post 116. The apparatus 10 can be used with many different types of batteries but is described herein with reference to a lead-acid battery.

Figure 1:
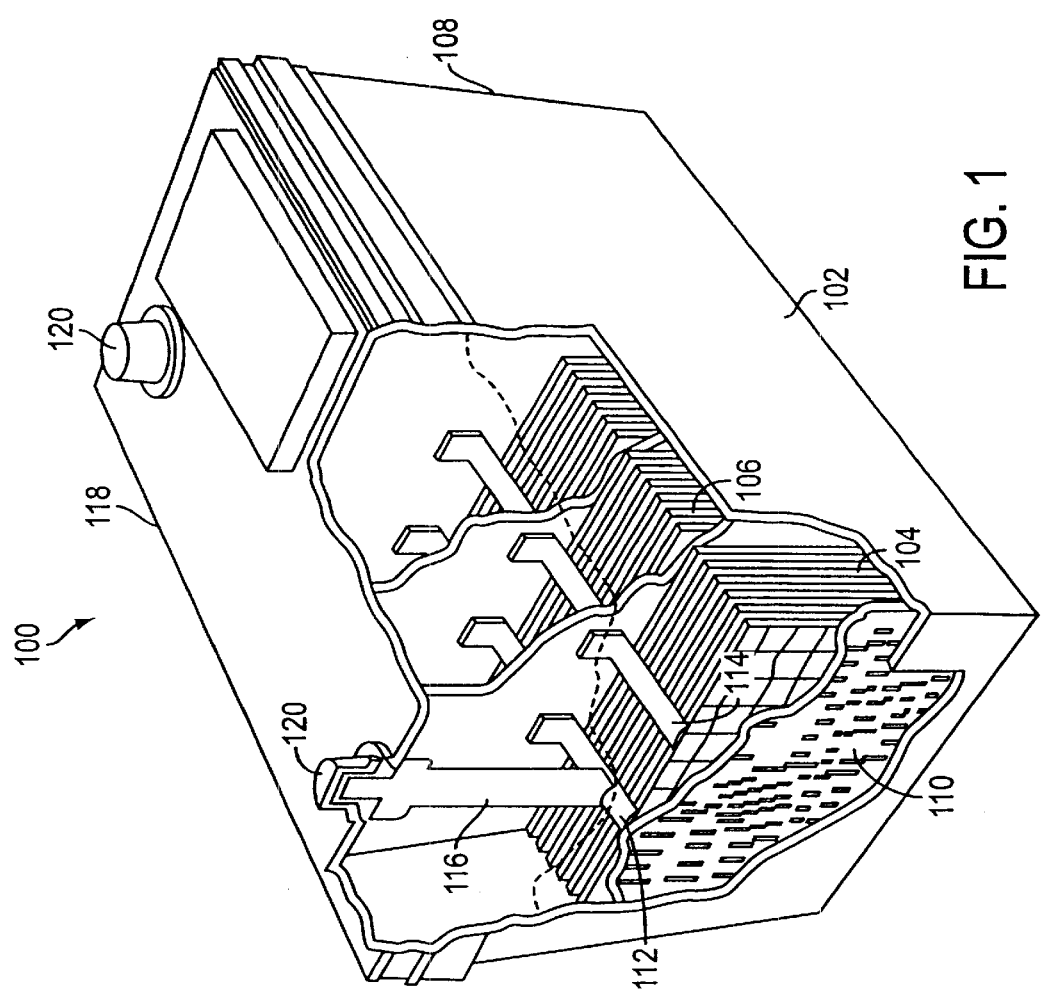
FIG. 1 is a perspective view of a typical lead-acid battery constructed in accordance with the prior art, wherein a portion of an outer case of the battery is cut away to reveal an interior of the battery.

FIG. 1 shows a typical lead-acid battery, generally designated 100, for use in powering vehicles, such as trucks, automobiles and motorcycles. The battery 100 generally includes a plastic casing 102 containing positive and negative lead plates 104, 106 immersed in an acid electrolyte 108. The plates 104, 106 are separated by non-conductive sheets 110, and a positive lead strap 112 connects the positive plates 104 while a negative lead strap 114 connects the negative plates 106. A positive lead post 116 is connected to the positive strap 112, while a negative post (not shown) is connected to the negative strap 114. Both posts extend through a plastic cover 118 sealing an open top of the casing 102. As also shown in FIGS. 2 and 3, sleeve-like terminals 120 are secured to the ends of the posts outside the cover for receiving cable connectors (not shown). The terminals 120 allow cable connectors to be tightened without causing stress on the soft lead posts 116. The posts 116 can include a collar 122 for mating and providing a seal with the cover 118, and a head 124 for receiving the terminals 120.

Referring to FIG. 4, the apparatus 10 constructed in accordance with the present disclosure is for measuring electrical energy passing to and from one of the battery posts 116. The apparatus 10 includes a resistor 12 for providing an electrical connection to the battery post 116. The resistor 12 has a known resistance "R", a first conducting surface 14 and a second conducting surface 16. The conducting surfaces 14, 16 are arranged such that current flow from the post 116 will travel through the resistor 12 from the first conducting surface 14 to the second conducting surface 16, and current flow to the post 116 travels through the resistor 12 from the second to the first conducting surfaces 14, 16. The energy measuring apparatus 10 further includes a first lead 18 electrically connected to the first conducting surface 14 of the resistor 12, and a second lead 20 electrically connected to the second conducting surface 16 of the resistor.

The apparatus 10 further includes a volt meter 22 connected between the first and the second leads 18, 20 for measuring a voltage drop "v" across the resistor 12, and a computer 24 having memory 26 for storing the known resistance "R" of the resistor 12, a processor 28, and an analog-to-digital converter 30 for converting an analog signal indicative of the voltage drop "v" from the volt meter 22 to a digital signal for the processor 28. The processor 28 is programmed to receive the digital signal indicative of the voltage drop "v" from the converter 30, retrieve the known resistance "R" from the memory 26, and calculate current flow "I" through the resistor 12 based on the measured voltage drop "v" and the known resistance "R". The processor 28 can be connected to an external device, such a central processing unit of an automobile, so that the external device can utilize the calculated current flow "I". Although not shown, the computer 24 can be provided with a clock and the processor 28 can be programmed to calculate the total charge of the battery based on the current flow and the charge time (when current is provided to the battery) or the drain time (when current is taken from the battery). It is envisioned that the computer 24 and the volt meter 22 can be attached to the cover 118 of the battery 100.

In the embodiment of FIG. 4, the resistor 12 is provided in the shape of a sleeve for being coaxially received between the terminal 120 and the head 124 of the battery post 116. The resistance "R" of the resistor 12 is calculated by multiplying the material volume of the resistor 12 by the resistivity of the material that the resistor 12 is made of.

The material from which the resistor is made can be lead or a non-lead material, as long as the resistance "R" of the resistor 12 is precisely known for purposes of determining current flow "I". Other conductive materials, such as copper, brass and bronze can alternatively be used. The resistor can be formed of powdered metal, stamped, machined, cast, or forged. In addition, the resistor can be plated or dipped in silver, gold, platinum or their alloys to provide a non-corrosive surface, and further dipped or coated with tin to provide better attachment between the lead post and plated resistor. The first conductive surface 14 of the resistor 12 is secured to the head 124 of the post 116, with lead solder for example, while the terminal 120 is secured to the second conductive surface 16, with lead solder for example.

As an example, the apparatus 10 is configured for use with a typical lead-acid vehicle battery to measure currents between 0.5 amperes and 1000 amperes, with the resistor 12 having a known resistance "R" of between about 50 microOhm and about 200 microOhm. Preferably, the resistor 12 is provided with a known resistance "R" of about 150 microOhm. The resistance value, of course, is determined based on a trade-off between current measurement accuracy and power dissipation at high current.

Figure 5:
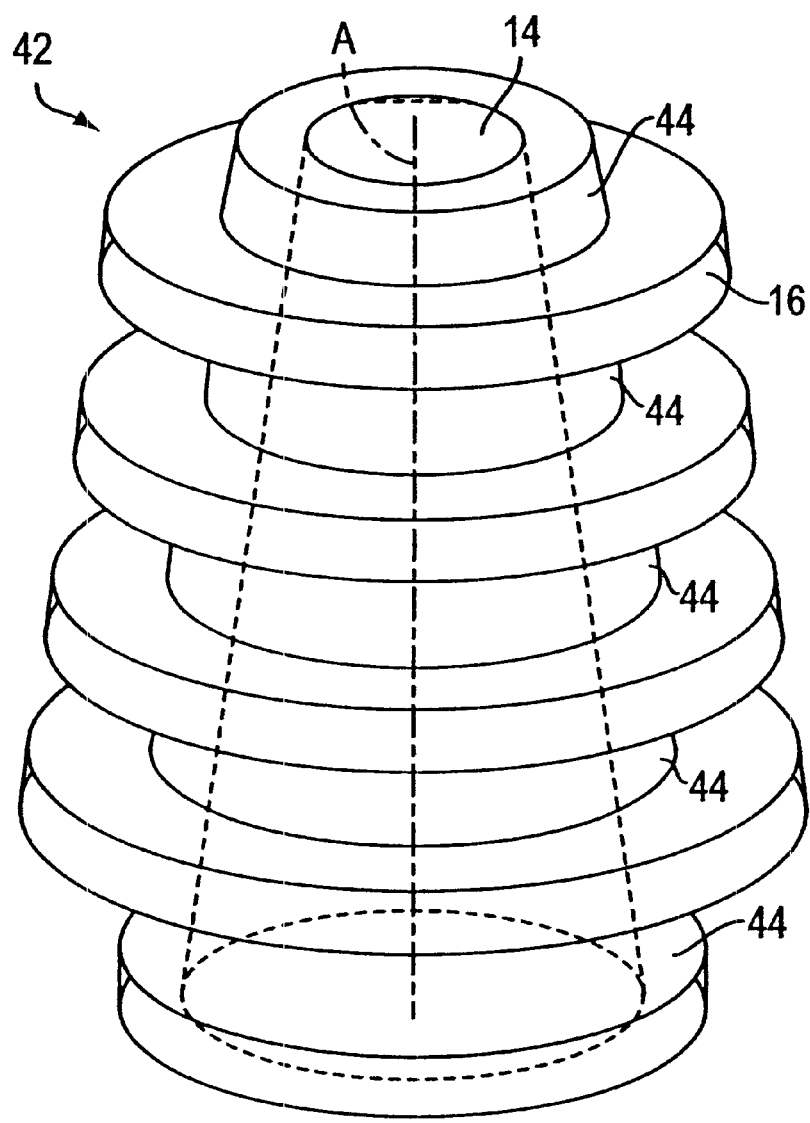
FIG. 5 is a perspective view of another resistor for use with the apparatus of the present disclosure.

Referring to FIG. 5, another resistor 42 for use with the apparatus of FIG. 4 is shown. The resistor 42 of FIG. 5 is similar to the resistor 12 of FIG. 4 such that similar elements have the same reference numerals. The second conducting surface 16 of the resistor 42 of FIG. 5, however, includes channels 44 for dissipating heat (the wall thickness of the resistor 42 has been exaggerated for purposes of illustrating the channels). As shown, the channels 44 are circumferentially formed in the resistor 42. However, the channels could extend parallel with respect to the longitudinal axis "A" of the resistor, or spiral about the axis.

Figure 6:
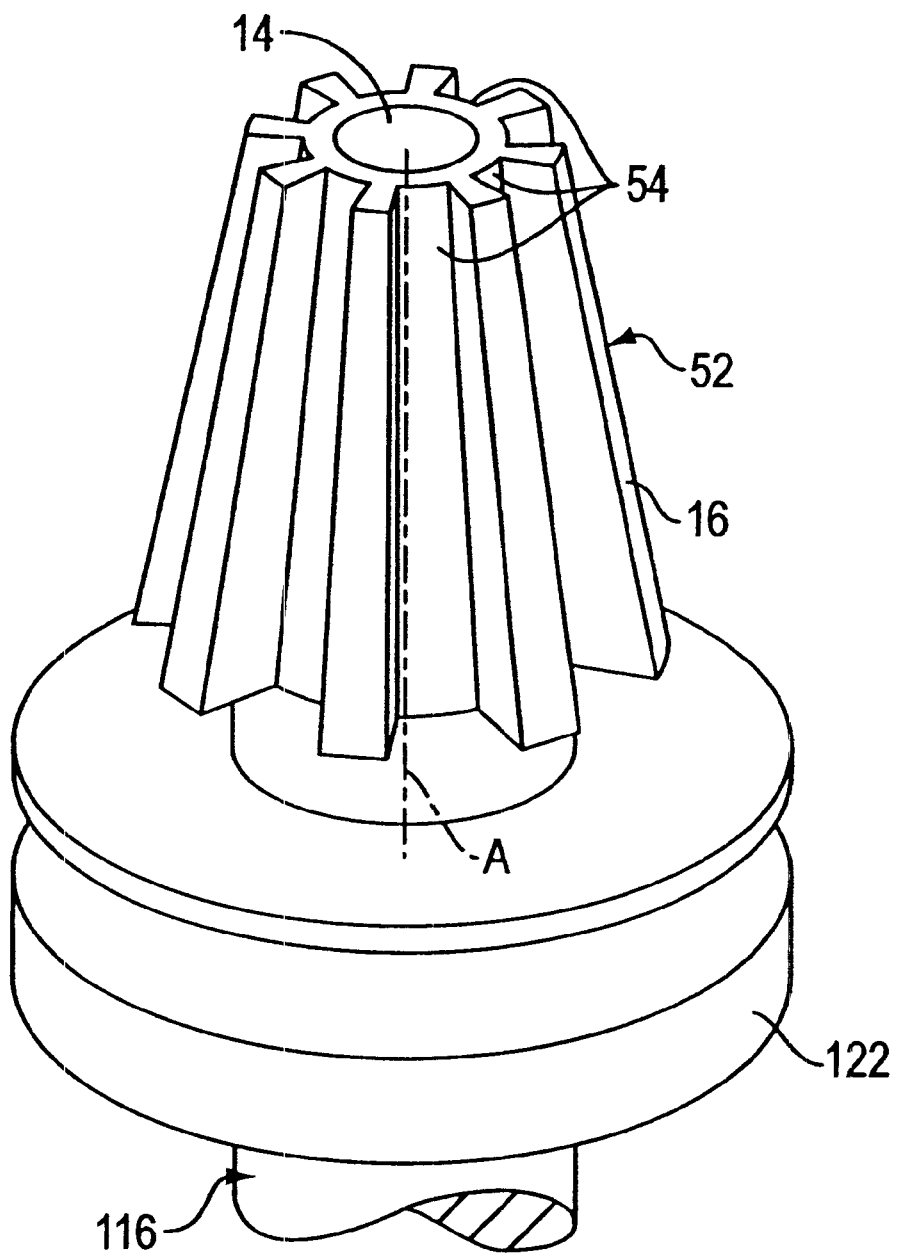
FIG. 6 is a perspective view of an additional resistor for use with the apparatus of the present disclosure.

Referring to FIG. 6, another resistor 52 for use with the apparatus of FIG. 4 is shown. The resistor 52 of FIG. 6 is similar to the resistor 12 of FIG. 4 such that similar elements have the same reference numerals. As shown, the resistor 52 is integrally formed as part of the battery post 116 in place of the head of the battery post, such that the battery terminal 120 can be secure directly to the second conductive surface 16 of the resistor 52. The second conducting surface 16 of the resistor 52 includes channels 44 for dissipating heat that extend parallel with respect to the longitudinal axis "A" of the resistor.

Referring to FIGS. 7, 8 and 9, another resistor 62 for use with the apparatus of FIG. 4 is shown. The resistor 62 of FIGS. 7, 8 and 9 is similar to the resistor 52 of FIG. 6 such that similar elements have the same reference numerals. As shown, the resistor 62 is integrally formed as part of the battery post 116 in place of the head of the battery post, such that the battery terminal 120 can be secure directly to the second conductive surface 16 of the resistor 62. However, the resistor 62 includes channels 64 between the first and the second conducting surfaces 14, 16. The channels 64 are for dissipating heat and extend parallel with respect to the longitudinal axis "A" of the resistor 62.

Figure 12:
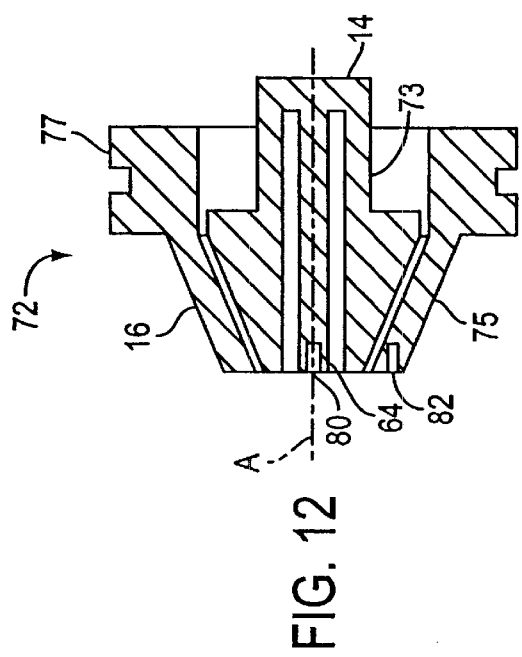
FIG. 12 is a sectional view of the resistor taken along line 12—12 of FIG. 11.
Figure 11:
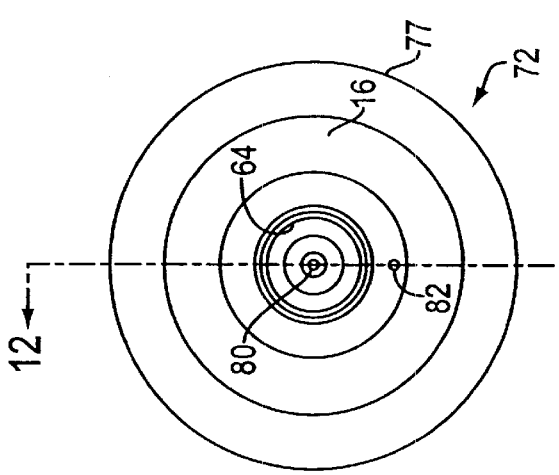
FIG. 11 is a top plan view of the resistor of FIG. 10.
Figure 10:
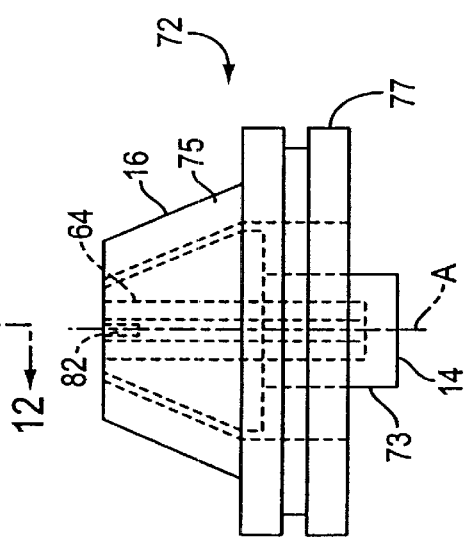
FIG. 10 is a side elevation view of another resistor for use with the apparatus of the present disclosure.

Referring to FIGS. 10, 11 and 12, another resistor 72 for use with the apparatus of FIG. 4 is shown. The resistor 72 of FIGS. 10, 11 and 12 is similar to the resistor 52 of FIG. 6 such that similar elements have the same reference numerals. As shown, the resistor 72 is formed as a collar and a head of the battery post, such that the battery terminal 120 can be secure directly to the resistor 72. The resistor 72 includes an inner portion 73 having a first conducting surface 14 of the resistor for connection to the battery post (not shown) and a sleeve-like outer portion 75, which fits over the inner portion 73 and has a second conducting surface 16 of the resistor. The outer portion 75 is secure to the inner portion 73 in a suitable manner, such as with lead solder for example. The resistor 72 also includes a single annular channel 64 within the inner portion 73 between the first and the second conducting surfaces 14, 16. The channel 64 is for dissipating heat and extends parallel with respect to the longitudinal axis "A" of the resistor 72. The outer portion 75 of the resistor 72 includes a collar 77 for mating and providing a seal with a cover of a battery.

The resistor 72 further includes a first bore 80 in the inner portion 73 and a second bore 82 in the outer portion 75. The bores 80, 82 are for receiving the leads 18, 20 for measuring the voltage drop between the first conducting surface 14 and the second conducting surface 16 of the resistor 72.

The present disclosure, accordingly, provides a new and improved apparatus for monitoring the flow of current into and out of a battery. As preferred, the apparatus is simple in design, relatively inexpensive and capable of manufacture in high volumes, and easily incorporated in new batteries. In addition, the presently disclosed apparatus can be retrofit into existing batteries.

Certain modifications and improvements will occur to those skilled in the art upon a reading of the foregoing description. By way of example, the resistor can be provided in place of the battery terminal, such that the cable connector would be connected directly to the resistor. Also, the first conducting surface of the resistor can include channels for dissipating heat. It should be understood that all such modifications and improvements are properly within the scope of the following claims. In addition, all embodiments shown and described in the present disclosure are within the scope of at least one of the claims. No embodiments or portions thereof are meant to be dedicated to the public prior to the expiration of any patent obtained for this disclosure.

What is claimed is:

1. An apparatus for measuring electrical current passing to and from a battery post, comprising:
   a resistor, the resistor being in the shape of a sleeve so as to be coaxially received on a battery post and to provide an electrical connection to the battery post, the resistor having a known resistance and a first conducting surface and a second conducting surface, wherein current flow from the battery post travels through the resistor from the first conducting surface to the second conducting surface of the resistor and current flow to the battery post travels through the resistor from the second conducting surface to the first conducting surface of the resistor;
   a first lead electrically connected to the first conducting surface of the resistor; and
   a second lead electrically connected to the second conducting surface of the resistor.

2. An apparatus according to claim 1, further comprising a volt meter connected between the first and the second leads for measuring the voltage drop across the resistor.

3. An apparatus according to claim 2, further comprising a computer including:
   memory for storing the known resistance of the resistor; and
   a processor programmed to,
      receive the measured voltage drop for the volt meter,
      retrieve the known resistance from the memory, and
      calculate current flow through the resistor based on the measured voltage drop and the known resistance.

4. An apparatus according to claim 1, wherein the known claim resistance of the resistor is between about 50 microOhm and about 200 microOhm.

5. An apparatus according to claim 1, wherein the resistor includes at least one channel between the first and the second conducting surfaces.

6. An apparatus according to claim 1, wherein the resistor is made from a material at least including lead.

7. A battery including the apparatus of claim 1, and further including:
   a case;
   a storage cell contained within the case for receiving and storing an electrical charge; and
   an electrically conductive post connected to the storage cell and extending out of the case;
   wherein the first conducting surface of the resistor is positioned on a portion of the post extending out of the case.

8. A battery according to claim 7, wherein the storage cell includes lead and lead-oxide plates immersed in an acid electrolyte.

9. A battery according to claim 7, further comprising a volt meter connected between the first and the second leads for measuring the voltage drop across the resistor.

10. A battery according to claim 9, further comprising a computer including:
    memory for storing the known resistance of the resistor; and
    a processor programmed to,
       receive the measured voltage drop from the volt meter,
       retrieve the known resistance from the memory, and
       calculate current flow through the resistor based on the measured voltage drop and the known resistance.

11. A battery according to claim 7, wherein the known resistance of the resistor is between about 50 microOhm and about 200 microOhm.

12. A battery according to claim 7, wherein the resistor is provided in the shape of a sleeve and the first conducting surface of the resistor is coaxially received on the battery post.

13. A battery according to claim 12, wherein the first conducting surface of the resistor includes at least one channel.

14. A battery according to claim 12, further comprising a sleeve-like terminal coaxially received on the second conducting surface of the resistor.

15. A battery according to claim 7, wherein the resistor includes at least one channel between the first and the second conducting surfaces.

16. A battery according to claim 7, wherein the resistor is made from a material at least including lead.

17. An apparatus for measuring electrical current passing to and from a battery post, comprising:
    a resistor being integrally formed as part of a battery post and providing an electrical connection to the battery post, the resistor having a known resistance and a first conducting surface and a second conducting surface, wherein current flow from the battery post travels through the resistor from the first conducting surface to the second conducting surface of the resistor and current flow to the battery post travels through the resistor from the second conducting surface to the first conducting surface of the resistor;
    a first lead electrically connected to the first conducting surface of the resistor; and
    a second lead electrically connected to the second conducting surface of the resistor.

18. An apparatus according to claim 17, wherein the second conducting surface of the resistor includes at least one channel.

19. A battery including the apparatus of claim 17, and further including:
    a case;
    a storage cell contained within the case for receiving and storing an electrical charge; and an electrically conductive post connected to the storage cell and extending out of the case;

wherein the first conducting surface of the resistor is positioned on a portion of the post extending out of the case.

20. A battery according to claim 19, wherein the storage cell includes lead and lead-oxide plates immersed in an acid electrolyte.

21. A battery according to claim 19, further comprising a volt meter connected between the first and the second leads for measuring the voltage drop across the resistor.

22. A battery according to claim 21, further comprising a computer including:

memory for storing the known resistance of the resistor; and a processor programmed to,
receive the measured voltage drop from the volt meter, retrieve the known resistance from the memory, and calculate current flow through the resistor based on the measured voltage drop and the known resistance.

23. A battery according to claim 19, wherein the known resistance of the resistor is between about 50 microOhm and about 200 microOhm.

24. A battery according to claim 19, wherein the resistor is integrally formed as part of the battery post.

25. A battery according to claim 24, wherein the first conducting surface of the resistor includes at least one channel.

26. A battery according to claim 19, wherein the resistor includes at least one channel between the first and the second conducting surfaces.

27. A battery according to claim 19, wherein the resistor is made from a material at least including lead.

28. A resistor for use in measuring electrical current passing to and from a battery post, comprising:

a resistor in the shape of a sleeve for being coaxially received on a battery post;

the resistor having a first conducting surface for contacting the battery post, and a second conducting surface, wherein current flow from the battery post travels through the resistor from the first conducting surface to the second conducting surface and current flow to the battery post travels through the resistor from the second conducting surface to the first conducting surface;

wherein the resistor has a known resistance, whereby current flow through the resistor can be determined based on a measured change in voltage between the first and the second conducting surfaces and the known resistance.

29. A resistor according to claim 28, wherein the known resistance is between about 50 microOhm and about 200 microOhm.

30. A resistor according to claim 28, wherein the known resistance is about 150 microOhm.

31. A resistor according to claim 28, wherein the second conducting surface includes at least one channel for dissipating heat.

32. A resistor according to claim 28, further including at least one channel between the first and the second conducting surfaces for dissipating heat.

33. A resistor according to claim 28, made from a material at least including lead.

34. A resistor according to claim 28, including an inner portion defining the first conducting surface and an outer portion received on the inner portion and defining the second conducting surface, and each portion includes bores for receiving leads for measuring a voltage change between the first and the second conducting surfaces.

35. A resistor according to claim 28, further including a lead secured to the first conducting surface and a lead secured to the second conducting surface, the leads for measuring a voltage change between the first and the second conducting surfaces.

36. A resistor for use in measuring electrical current passing to and from a battery post, comprising:

a resistor in the shape of a head of a battery post;

the resistor having a first conducting surface for contacting the battery post and a second conducting surface, wherein current flow from the battery post travels through the resistor from the first conducting surface to the second conducting surface and current flow to the battery post travels through the resistor from the second conducting surface to the first conducting surface;

wherein the resistor has a known resistance, whereby current flow through the resistor can be determined based on a measured change in voltage between the first and the second conducting surfaces and the known resistance.

37. A resistor according to claim 36, wherein the known resistance is between about 50 microOhm and about 200 microOhm.

38. A resistor according to claim 36, wherein the known resistance is about 150 micro Ohm.

39. A resistor according to claim 36, wherein the second conducting surface includes at least one channel for dissipating heat.

40. A resistor according to claim 36, further including at least one channel between the first and the second conducting surfaces for dissipating heat.

41. A resistor according to claim 36, made from a material at least including lead.

42. A resistor according to claim 36, including an inner portion defining the first conducting surface and an outer portion received on the inner portion and defining the second conducting surface, and each portion includes bores for receiving leads for measuring a voltage change between the first and the second conducting surfaces.

43. A resistor according to claim 36, further including a lead secured to the first conducting surface and a lead secured to the second conducting surface, the leads for measuring a voltage change between the first and the second conducting surfaces.

* * * * *

UNITED STATES PATENT AND TRADEMARK OFFICE
CERTIFICATE OF CORRECTION

PATENT NO.   : 6,573,723 B2
DATED        : June 3, 2003
INVENTOR(S)  : David C. Batson It is certified that error appears in the above-identified patent and that said Letters Patent is hereby corrected as shown below:

<u>Title page,</u>
Item [75], Inventor, should read -- David C. Batson --

Signed and Sealed this

Eighteenth Day of May, 2004

JON W. DUDAS
*Acting Director of the United States Patent and Trademark Office*